United States Patent [19]

Takakura

[11] Patent Number: 5,023,166

[45] Date of Patent: Jun. 11, 1991

[54] METHOD FOR FORMING PLATE CHARACTERS IN A HALF-TONE GRAVURE PLATEMAKING PROCESS

[75] Inventor: Kouichi Takakura, Chiba, Japan

[73] Assignee: Think Laboratory Co., Ltd., Chiba, Japan

[21] Appl. No.: 589,167

[22] Filed: Sep. 26, 1990

[30] Foreign Application Priority Data

Sep. 27, 1989 [JP] Japan ................................. 1-251228

[51] Int. Cl.$^5$ ............................................. G03F 7/00
[52] U.S. Cl. .................................. 430/307; 430/300;
101/150; 101/170; 101/401.1
[58] Field of Search ................ 430/300, 307; 101/150,
101/170, 401.1

[56] References Cited

U.S. PATENT DOCUMENTS 3,804,622 4/1974 Bergin ................................. 430/307
3,980,018 9/1976 Ichikawa ............................. 101/170

FOREIGN PATENT DOCUMENTS 57-012697 1/1982 Japan ................................... 101/150

Primary Examiner—Charles L. Bowers, Jr.
Assistant Examiner—Janis L. Dote
Attorney, Agent, or Firm—Koda and Androlia

[57] ABSTRACT

A method for forming plate characters in a half-tone gravure platemaking process being characterized in that a laser beam moved so that the laser beam is intermittently irradiated onto a light sensitive material and a plate character is formed on the light-sensitive material by exposure. The character thus formed is made up with a character frame portion and a character fill portion surrounded by the character frame portion, the character frame portion being formed by a plurality of intermittently arranged groove-form cells each having a predetermined length and a width which can prevent flow of ink when ink is applied by wiping the plate surface with a doctor, and the character fill portion being formed by dot-form cells which have a shadow-portion dot percentage.

2 Claims, 1 Drawing Sheet

FIG. 1
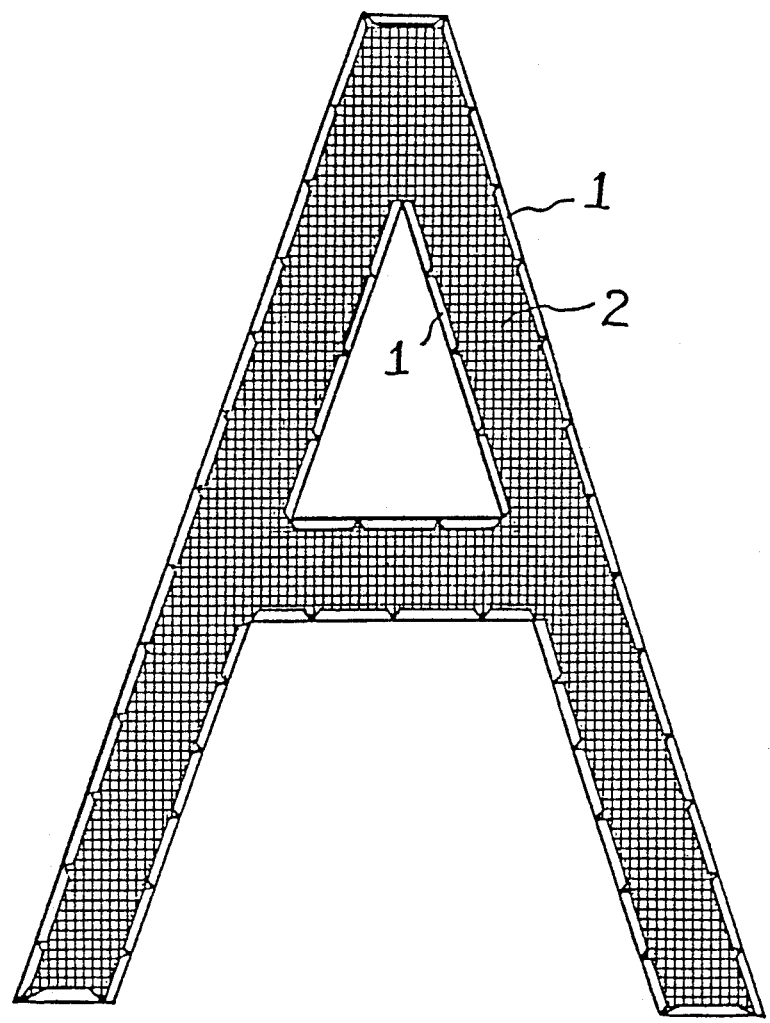
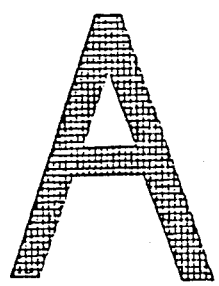
FIG. 2(a)
PRIOR
ART
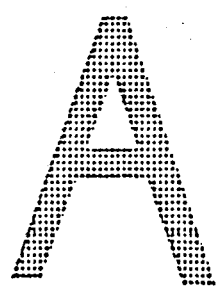
FIG. 2(b)
PRIOR
ART
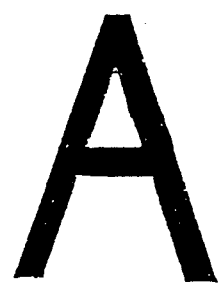
FIG. 2(c)
PRIOR
ART

METHOD FOR FORMING PLATE CHARACTERS IN A HALF-TONE GRAVURE PLATEMAKING PROCESS

BACKGROUND OF THE INVENTION

1. Field of the Invention

The present invention relates to a method for forming plate characters in a half-tone gravure platemaking process which provides the same character quality as is found in type printing.

2. Prior Art

FIGS. 2(a) through 2(c) show a process of printing a letter "A" formed by a plate character obtained by the prior art half-tone gravure platemaking method.

FIG. 2(a) shows the plate character "A" with a screen applied thereto, and the entire plate character consists of dot-form cells. The dot-form cells are formed by etching so that they have a shadow-portion dot percentage.

FIG. 2(b) shows a screen-applied plate character "A" of FIG. 2(a) upon which ink has been applied. When transfer-printing is performed onto paper, etc., the ink spreads and the blank-paper portions left by screen wires disappear, thus producing an English letter "A" as shown in FIG. 2(c) in which the entire character is black.

Thus, conventionally, plate characters are made up of dot form cells which have a shadow-portion dot percentage. Accordingly, the frames (or outlines) of the half-tone gravure characters (printed characters) are notched, and its quality is inferior to that of type-printed characters. Particularly, the quality of small characters is very low.

In an attempt to solve the problems described above, the inventor of the present application filed a patent application in Japan (Japanese Patent Application No. 1-171382). According to the method for forming plate characters in a half-tone gravure platemaking process described in this Japanese patent application, the ink in the character frame portions (or areas along the character outlines) is thick, and the character frame portions are far sharper than that obtained in type printing. Also, the character fill portion becomes solid black, accomplishing high-quality character printing. However, this method has some problems. If aqueous inks, which have a somewhat high fluidity, are used, ink flow occurs in the character frame portions.

SUMMARY OF THE INVENTION

Accordingly, the object of the present invention is to provide a method for forming plate characters in a half-tone gravure platemaking process so that sharp character frames (such as those seen in type printing) in half-tone gravure characters are obtained, and a high-quality character printing is accomplished without causing any ink flow in the character frame portion.

The objects are accomplished by a unique method wherein (a) a laser beam of a laser exposure device is moved so that a light-sensitive material is subject to flashing irradiation of the laser beam, thus forming plate characters on the light-sensitive material by exposure, (b) each of the plate characters consists of a character frame portion and a character fill portion which is surrounded by the character frame portion, (c) the character frame portion is formed by a plurality of intermittent groove-form cells each having a prescribed length and width that prevents the flow of ink when ink is applied by wiping the plate surface with a doctor, and (d) the character fill portion is formed by dot-form cells which have a shadow-portion dot percentage.

Thus, in the half-tone gravure printing plates (in a roll or flat plate form) formed by the method of the present invention, the character frame portion is formed by a plurality segmental of groove-form cells each having a certain length and sufficiently small width so that ink flow does not occur in the cells when ink is applied by wiping the plate surface with a doctor, and the character fill portion is formed by dot-form cells which have a shadow-portion dot percentage.

Accordingly, when the plate surface is wiped by a doctor, ink is applied in a favorable manner to the entire surface of each plate character, i.e., to both the character frame portion and the character fill portion. As a result, the ink in the character frame portion of the printed characters is thick, the character frame portion is far sharper than that of type printing, and the character fill portion is black, achieving high-quality character printing.

BRIEF DESCRIPTION OF THE DRAWINGS

FIG. 1 is an enlarged illustration of a plate character formed by the method of forming plate characters in a half-tone gravure platemaking process of the present invention; and FIGS. 2(a) through 2(c) show a process of forming and printing a half-tone gravure character with a conventional method of forming plate characters in a half-tone gravure platemaking process.

DETAILED DESCRIPTION OF THE INVENTION

A description of the present invention will be made below with reference to a direct platemaking process in which a laser beam is moved so that the laser beam is intermittently (or flashingly) irradiated onto the surface of a plate roll, which is coated with a light-sensitive film, thus forming a character information (by exposure) on the light-sensitive film as an aggregation of beam dots.

More specifically, a single laser beam is split by a beam splitter into approximately 20 beams, which are of equal intensity and arranged in a chain form, and each beam is irradiated onto a plate roll (which is coated with a light sensitive film to constitute the light-sensitive material) by a multi-type light modulator (which is driven in accordance with character information) and through auto-focus lenses so that laser exposure is performed as the laser scans.

When a letter "A", for example, is to be written onto the plate roll via such a laser exposure, multi-electrodes of the multi-type light modulator are driven so that the character frame portion is continuously exposed (by the laser beams) and the character fill portion (i.e., the area inside the character frame portion) is exposed so that it is filled with dot-form cells having a shadow-portion dot percentage.

The multi-type light modulator is driven so that it receives character information from a memory which stores such character information and converts such information into necessary signals, and then distributes the signals to the multi-electrodes. The character information stored in the memory is laid out together with image information in a layout scanner.

In the layout scanner, an accessory program is used so that picture element information is defined separately in terms of the character frame portion and character fill portion of the character displayed on a graphic display. Thus, so as to obtain a character as shown in FIG. 1, the character frame portion 1 is defined as having a 100% shade gradient and having a line width of 30 microns, for instance, which is sufficiently narrow so that no ink flow occurs when ink is applied by wiping the plate surface with a doctor; and the character fill portion 2 is defined as having a shadow-portion dot percentage, for example, a shade gradient of 75%. These values are stored in the memory.

It is preferable to form both ends of the character frame portion 1 as sharp ends which are triangular in shape so that the sharp ends of the character frame portion come in point contact with the sharp ends of the character frame portion of the adjacent characters.

When a plate roll which has been laser-exposed, as described above, is developed/etched, plate characters are formed. The character frame portion 1 of each of the plate characters is formed by intermittent groove-form cells (groove width: 30 microns), and the character fill portion 2 (i.e., the area inside the character frame portion) is formed by dot-form cells which have a shadow-portion dot percentage.

When ink is applied to the plate character and transfer printing is performed onto paper, etc., the ink is thick in the character frame portion, and it spreads out as in conventional methods in the character fill portion (i.e., the area inside the character frame portion) so that the blank paper areas left by the screen wires disappear. Thus a letter "A", which is sharp and black overall with no notching, is obtained.

The method of forming a plate character in a halftone gravure platemaking process provided by the present invention may also be used in which (a) a laser beam is moved so that a light-sensitive film (silver salt film) wrapped around a drum is subject to a flashing irradiation of the laser beam, thus forming, by exposure, character information as aggregates of beam dots, (b) the light-sensitive film is then developed and wrapped around a plate roll coated with another light-sensitive film so that another exposure is performed, and (c) developing/etching is then performed so that plate characters which are made up of network points are formed.

As describe above, according to the method of the present invention, the ink in the character frame portion is thick and there is no danger that ink flow would occur in the character frame portion. Accordingly, the character frame portion is far sharper than in the case of type printing, thus achieving high-quality character printing.

I claim:

1. A method for forming plate characters in a halftone gravure platemaking process, which is characterized in that (a) a laser beam of a laser exposure apparatus is moved so that a light sensitive material is subjected to flashing irradiation of said laser beam, thus causing a formation of plate characters on said light-sensitive material by exposure, (b) each of said plate characters consists of a character frame portion and a character fill portion which is surrounded by said character frame portion, (c) said character frame portion is formed by intermittent groove-form cells each having a prescribed length and a width that prevents flow of ink when ink is applied by wiping said plate surface with a doctor, and (d) said character fill portion is formed by dot-form cells which have a shadow-portion dot percentage.

2. A method for forming plate characters in a halftone gravure platemaking process wherein a laser beam is moved so as to be intermittently irradiated onto a light sensitive material, thus forming a plate character on said light-sensitive material by exposure so that each of said plate characters consists of a character frame portion and a character fill portion which is surrounded by said character frame portion, said character frame portion being formed by intermittent groove-form cells each having a prescribed length and a width that prevents flow of ink when ink is applied by wiping said plate surface with a doctor, and said character fill portion being formed by dot-form cells which have a shadow-portion dot percentage.

* * * * *